United States Patent
Tanaka et al.

(10) Patent No.: US 6,798,730 B2
(45) Date of Patent: Sep. 28, 2004

(54) SUPERIMPOSING CIRCUIT MODULE FOR REDUCING SPURIOUS ELECTROMAGNETIC WAVE EMISSIONS AND SMALL VARIATIONS IN CIRCUIT PARAMETERS

(75) Inventors: Koji Tanaka, Takefu (JP); Kazuhiro Iida, Shiga-ken (JP); Mitsuhiro Matsumoto, Shiga-ken (JP)

(73) Assignee: Murata Manufacturing Co., Ltd, Kyoto (JP)

( * ) Notice: Subject to any disclaimer, the term of this patent is extended or adjusted under 35 U.S.C. 154(b) by 626 days.

(21) Appl. No.: 09/841,535

(22) Filed: Apr. 23, 2001

(65) Prior Publication Data

US 2002/0154592 A1 Oct. 24, 2002

(30) Foreign Application Priority Data

Apr. 21, 2000 (JP) ........................................ 2000-120945

(51) Int. Cl.⁷ .............................................. G11B 7/00
(52) U.S. Cl. ..................................................... 369/121
(58) Field of Search ................................. 369/120, 121, 369/122, 116; 336/200; 333/184, 185

(56) References Cited

U.S. PATENT DOCUMENTS 5,592,134 A  *  1/1997  Ogata et al. ................. 333/185
5,977,845 A  * 11/1999  Kitahara ....................... 333/184
6,462,638 B2 * 10/2002  Imada et al. ................. 336/200

FOREIGN PATENT DOCUMENTS

| JP | 07-093758 | 4/1995 |
| JP | 07-105561 | 4/1995 |
| JP | WO98/01856 | 1/1998 |
| JP | 11-144283 | 5/1999 |
| JP | 11-232683 | 8/1999 |
| KR | 0205775 | 7/1999 |

* cited by examiner

*Primary Examiner*—Nabil Hindi
(74) *Attorney, Agent, or Firm*—Keating & Bennett, LLP

(57) ABSTRACT

A small-sized superimposed circuit module has reduced spurious electromagnetic wave emission and small variations in circuit parameters. A resonance circuit portion of an oscillator and a portion of a noise rejection filter are embedded in a multilayer ceramic substrate, and the remaining circuit components are mounted on the surface of the multilayer substrate. The upper surface of the multilayer substrate is covered with a metal case.

36 Claims, 6 Drawing Sheets

SUPERIMPOSING CIRCUIT MODULE FOR REDUCING SPURIOUS ELECTROMAGNETIC WAVE EMISSIONS AND SMALL VARIATIONS IN CIRCUIT PARAMETERS

BACKGROUND OF THE INVENTION

1. Field of the Invention

The present invention relates to a superimposing circuit module, and more particularly, to a superimposing circuit module used as a high-frequency superimposing circuit for use in conjunction with a laser diode in an optical pickup for reading or recording/reading information on/from an information storage medium such as a magnetooptical disk.

2. Description of the Related Art

In an optical pickup for recording/reading information on/from a magnetooptical storage medium, information is read by detecting light reflected from a magnetooptical disk illuminated with a light beam, on the basis of the Kerr effect. However, in the reading of information from a magnetooptical disk, if light returns from the magnetooptical disk to an end surface of a laser diode, the reproduced signal is modulated by the returned light. To avoid this problem, the optical pickup includes a high frequency superimposing circuit having a high frequency oscillator for canceling out the effect of the light returned to the end surface of the laser diode.

FIG. 2 is a cross-sectional view illustrating the structure of a conventional superimposing circuit module 31 functioning as a high frequency superimposing circuit. In the conventional high frequency superimposing circuit, as disclosed in, for example, Japanese Unexamined Patent Application Publication No. 7-93758 or 7-105561, chip-shaped components 36 such as transistors, capacitors, resistors, and inductors are mounted on both sides of a printed circuit board 35, and the printed circuit board 35 is placed in a case 32 such that it is positioned by a protrusion 34. The case 32 is covered with a cover 33. Leads 37a, 37b, and 37c of a laser diode 25 disposed on the bottom surface of the holder case 32 are passed through the printed circuit board 35 and soldered to interconnection patterns on the printed circuit board 35. Furthermore, three terminals pins 38a, 38b, and 38c, which extend through the printed circuit board 35 and are connected to interconnection patterns on the printed circuit board 35, are arranged to extend through a feedthrough capacitor 39 disposed on the bottom inner surface of the case 32 and are extended to the outside from the bottom surface of the case 32a.

In the conventional superimposing circuit module, as shown in FIG. 2, a large area is needed to mount chip-shaped components on both sides of the printed circuit board to form the circuit including the oscillator. As a result, the size of the printed circuit board becomes large and thus, the total size of the superimposing circuit module becomes large.

As the size of the superimposing circuit module increases, the length of the interconnection patterns disposed on the surfaces of the printed circuit board increases. The increase in the length of the interconnection patterns results in an increase in undesired spurious signal emission. To block the spurious signal emission, it is necessary to entirely shield the printed circuit board with the case and the cover.

If the size becomes even larger, the result is further increases in cost and the number of production steps because the substrate must be entirely covered with the case and the cover and besides because the feedthrough capacitor must be mounted.

Furthermore, in the above-described superimposing circuit module, because discrete components are mounted on the printed circuit board, circuit parameters of the respective circuit components such as inductors and capacitors (in particular, parameters which determine the resonance frequency of the resonance circuit) should be carefully selected to achieve matching among these circuit components. The process of accurately determining the circuit parameters requires a long time.

SUMMARY OF THE INVENTION

In order to overcome the problems described above, preferred embodiments of the present invention provide a small-sized superimposed circuit module having reduced spurious electromagnetic wave emission and having small variations in the circuit parameters.

According to a preferred embodiment of the present invention, a superimposing circuit module is arranged to minimize the effect of returned light upon a laser light source for illuminating an information storage medium with a laser beam, the superimposing circuit module including a multiplayer substrate and a portion or all of the circuit elements of an oscillator in the superimposing circuit are embedded in the multilayer substrate. In particular, it is desirable that, of the circuit elements defining the oscillator, some or all of a resonance circuit including a capacitor and an inductor or including a stripline, are embedded in the multilayer substrate.

In this superimposing circuit module according to this preferred embodiment of the present invention, because some or all of the circuit elements of the oscillator in the superimposing circuit are embedded in the multilayer substrate, the size of the oscillator is greatly reduced and thus the total size of the superimposing circuit module is greatly reduced.

The reduction in the size of the oscillator and the superimposing circuit module results in a reduction in the length of the interconnection pattern provided on the surface of the substrate, which in turn results in a reduction in spurious signal emission.

Furthermore, the multilayer structure and the small size of the oscillator allow reductions in the number of required manufacturing steps and manufacturing cost.

Furthermore, in this superimposing circuit module, because the circuit elements of the oscillator can be formed by printing electrodes or interconnection conductors, the variations in the circuit parameters can be minimized and thus, the matching adjustment becomes unnecessary.

According to another preferred embodiment of the present invention, a superimposing circuit module arranged to reduce the effects of returned light upon a laser light source for illuminating an information storage medium with a laser beam is characterized in that some of or all of circuit elements of a noise rejection filter in the superimposing circuit are embedded in a multilayer substrate. In particular, it is desirable that, of the circuit elements defining the noise rejection filter, a capacitor, an inductor, or a stripline be embedded in the multilayer substrate.

In this superimposing circuit module according to preferred embodiments of the present invention, because some or all of circuit elements of the noise rejection filter are embedded in the multilayer substrate, the size of the noise rejection filter is greatly reduced and thus, the total size of the superimposing circuit module is greatly reduced.

The reduction in the size of the noise rejection filter and the superimposing circuit module results in a reduction in the length of the interconnection pattern disposed on the surface of the substrate, which in turn results in a reduction in spurious signal emission.

Furthermore, the multilayer structure and the small size of the noise rejection filter allow reductions in the number of manufacturing steps and manufacturing cost.

Furthermore, in this superimposing circuit module, because the circuit elements of the noise rejection filter can be formed by printing electrodes or interconnection conductors, the variations in the circuit parameters can be minimized and thus the matching adjustment becomes unnecessary.

In the superimposing circuit module according to a preferred embodiment of the present invention, it is desirable that an amplification device be mounted on the surface of the multilayer substrate. Although the amplification device such as a transistor is difficult to embed in the multilayer substrate, it is easy to mount the amplification device on the surface of the multilayer substrate. The mounting of the amplification device on the surface of the multilayer substrate makes it possible to construct the superimposing circuit module to have a simple structure.

In the superimposing circuit module according to various preferred embodiments of the present invention, it is desirable that the surface of the multilayer substrate is covered with a metal case.

Covering the surface of the multilayer substrate with the metal case allows for a further reduction in the spurious signal emission. Furthermore, because only the surface of the multilayer substrate is needed to be covered with the metal case, the size of the superimposing circuit module can be reduced and thus, the cost thereof can also be reduced.

In the superimposing circuit module according to various preferred embodiments of the present invention, it is desirable that the multilayer substrate be defined by laminating a copper electrode film and a low-temperature-baked ceramic layer.

If the multilayer substrate is formed by lamination of a copper electrode film and a low-temperature-baked ceramic layer, it becomes possible to embed, in the multilayer substrate, not only a capacitor plate and an inductor but also a shield plate for blocking an electromagnetic wave.

Other features, elements, characteristics and advantages of the present invention will become more apparent from the following detailed description of preferred embodiments of the present invention with reference to the attached drawings.

DETAILED DESCRIPTION OF PREFERRED EMBODIMENTS

Figure 1:
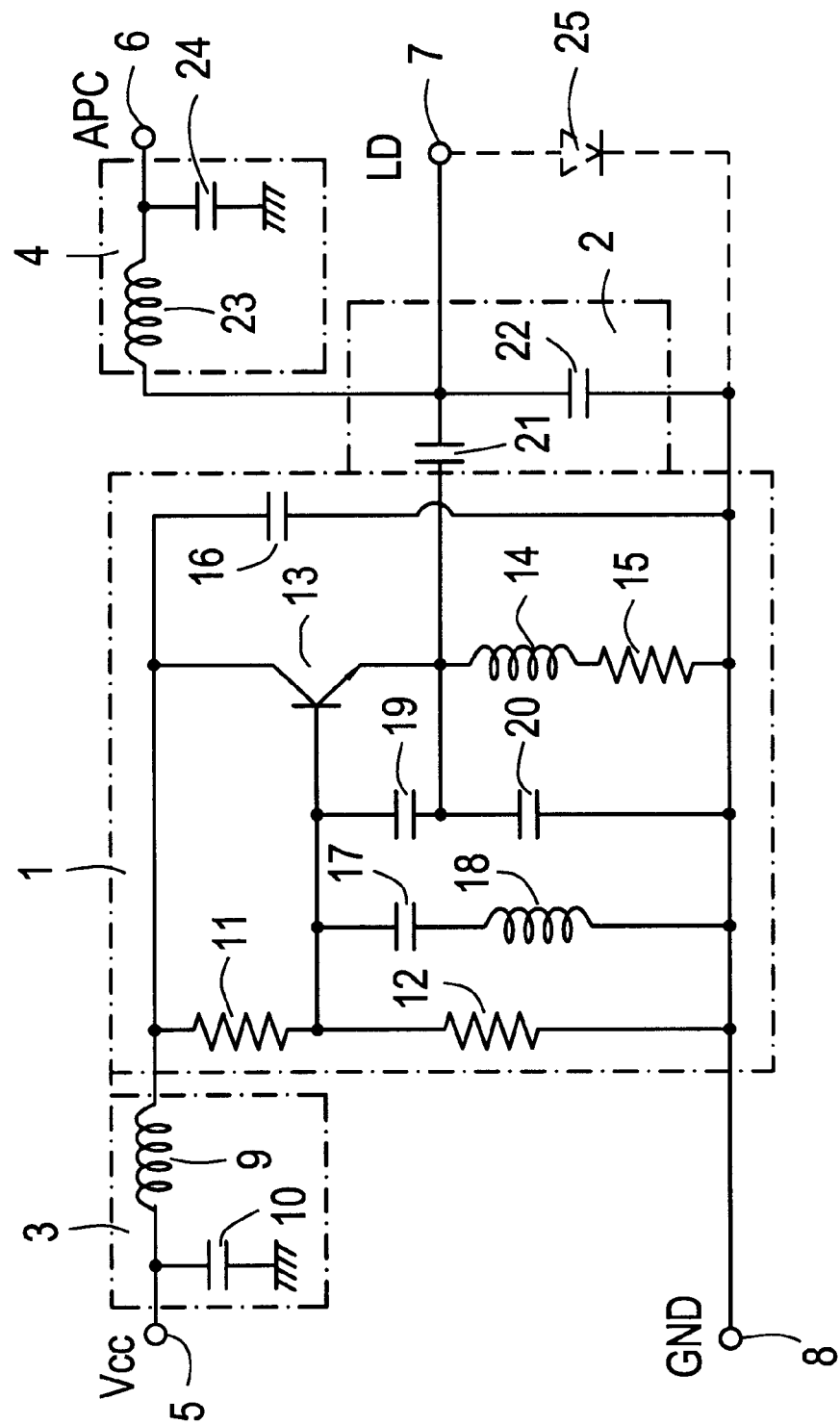
FIG. 1 is a circuit diagram of a superimposing circuit according to a preferred embodiment of the present invention.
Figure 2:
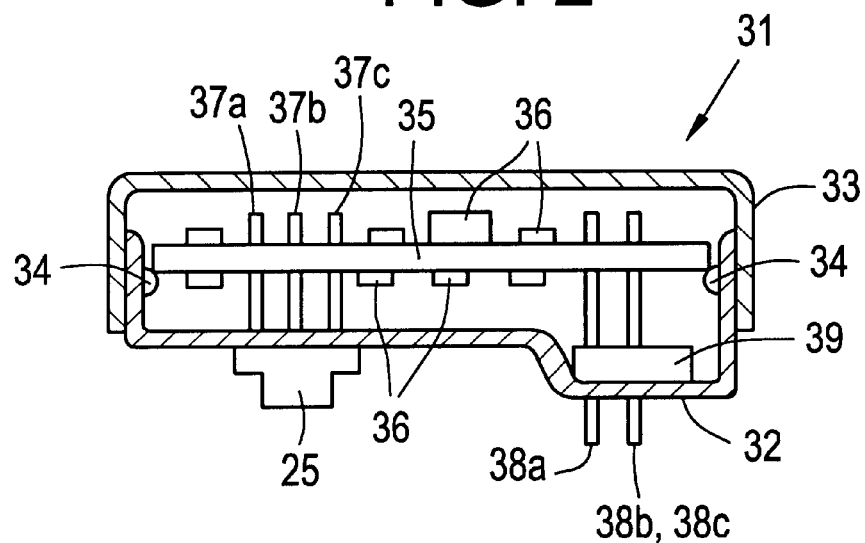
FIG. 2 is a cross-sectional view illustrating the structure of a conventional superimposing circuit module.

FIG. 1 is a circuit diagram of a high frequency superimposing circuit according to a preferred embodiment of the present invention. This superimposing circuit preferably includes an oscillator 1, a matching circuit 2, noise rejection filters 3 and 4, a power supply terminal 5 connected via a switch to a power supply line of the high frequency superimposing circuit, a terminal (APC terminal) 6 connected to a laser diode driving current supply line of an automatic power controller (APC), a terminal (LD terminal) 7 connected to one end of a laser diode 25, the other end of which is grounded, and a terminal (GND terminal) 8 which is grounded. A high power laser diode is preferably used as the laser diode 25 connected between the LD terminal 7 and the GND terminal 8 of the superimposing circuit. The laser diode 25 emits a laser beam for illuminating a magnetooptical disk. Electric power is supplied to the laser diode 25 via the APC terminal 6, and electric power is supplied to the oscillator 1 via the power supply terminal 5.

The circuit configuration of the high frequency superimposing circuit shown in FIG. 1 is further described below. The noise rejection filter 3 is disposed between the power supply terminal 5 and the oscillator 1 to remove noise from the power supply line of the superimposing circuit. That is, an inductor 9 is disposed between the power supply terminal 5 and the input terminal of the oscillator 1, and a capacitor 10 is disposed between the power supply terminal 5 and the GND terminal 8 so that the noise rejection filter 3 of the τ type is defined with the inductor 9 and the capacitor 10.

In the oscillator 1, resistors 11 and 12 are connected in series between the input of the oscillator 1 and the GND terminal 8, and a transistor 13, an inductor 14, and a resistor 15 are connected in series between the input of the oscillator 1 and the GND terminal 8. Furthermore, a capacitor 16 is disposed between the input of the oscillator 1 and the GND terminal 8. The base of the transistor 13 is also connected to the node between the resistors 11 and 12.

A capacitor 17 and an inductor 18 are connected in series between the base of the transistor 13 and the GND terminal 8. Furthermore, two capacitors 19 and 20 are connected in series between the base of the transistor 13 and the GND terminal 8. The node between the capacitors 19 and 20 is connected to the emitter of the transistor 13.

A capacitor 21 and a capacitor 22 are connected in series between the emitter of the transistor 13 and the GND terminal 8 so as to define a matching circuit 2 for achieving matching with the laser diode 25. The node between the capacitors 21 and 22 is connected to the LD terminal 7. The noise rejection filter 4 of the τ type for removing noise from the laser diode driving circuit is defined by an inductor 23 disposed between the LD terminal 7 and the APC terminal 6 and a capacitor 24 disposed between the APC terminal 6 and the GND terminal 8.

In this superimposing circuit, the laser diode 25 is forward biased and the oscillator 1 is activated. The power supply terminal 5 defines both the terminal of the power supply terminal (Vcc) of the high frequency superimposing circuit and the circuit switching terminal (RMS). That is, the power supply terminal is connected to the power supply of the high frequency superimposing circuit. When the power supply connected to the terminal 5 is turned on/off, the superimposing circuit is turned on/off. A DC voltage supplied via the noise rejection filter 3 is divided by the resistors 11 and 12, and the divided voltage is applied to the base of the transistor 13 of the oscillator 1. When the power supply of the high frequency superimposing circuit is turned on, the voltage of the power supply is immediately applied to the circuit switching terminal, and thus the transistor 13 is activated and oscillation starts. The oscillating frequency of the oscillator 1 is determined by the parameters of the resonance circuit defined by the capacitors 17, 19, and 20 and the inductor 18.

This high frequency superimposing circuit including the oscillator 1 is used to cancel out the effect of light returned to the end surface of the laser diode 25 in reading of information from a magnetooptical disk, thereby preventing modulation.

Figure 3:
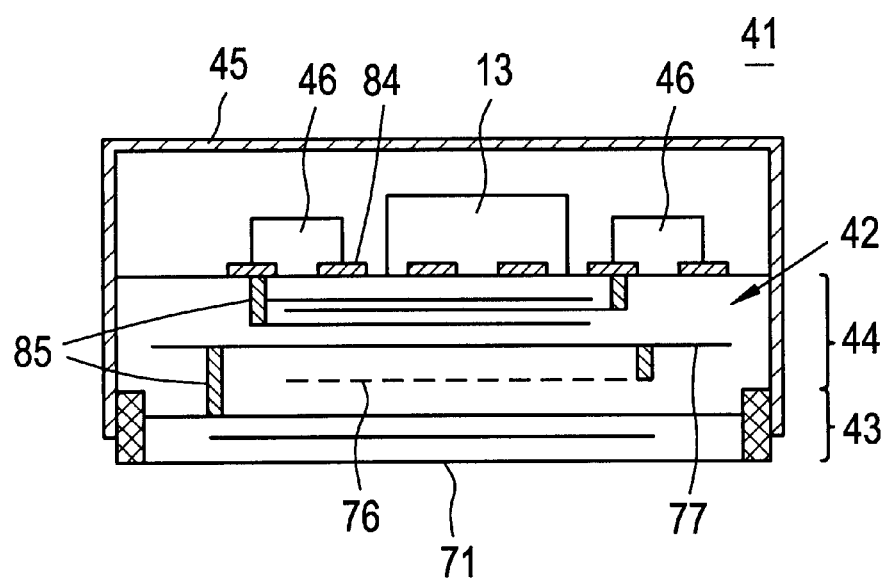
FIG. 3 is a cross-sectional view illustrating the structure of a superimposing circuit module according to a preferred embodiment of the present invention.

FIG. 3 is a cross-sectional view illustrating the structure of a superimposing circuit module 41 according to a first preferred embodiment of the present invention. This superimposing circuit module 41 embodies the superimposing circuit shown in FIG. 1 for use in conjunction with an optical pickup. The superimposing circuit module 41 may be produced as follows. First, copper paste patterns are printed on the surfaces of respective ceramic green sheets and they are placed one on another. They are then baked at a low temperature thereby forming a multilayer substrate 42 including low-temperature-baked ceramic layers and copper electrode films such that some circuit components (capacitors and inductors in this specific example) are embedded in the multilayer substrate 42. The remaining circuit components are mounted on the surface of the multilayer substrate 42, and the multilayer substrate 42 is covered with a metal case 45.

Figure 4A:
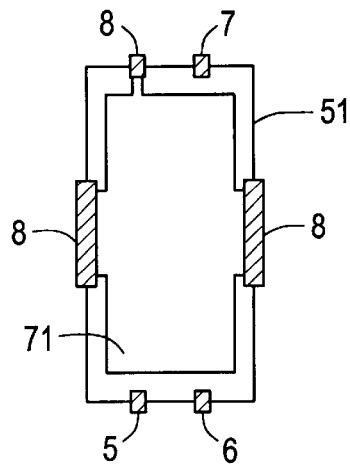
FIGS. 4A and 4B are top and bottom views illustrating the structure of the lowest layer of a multilayer substrate of the superimposing circuit module.
Figure 4B:
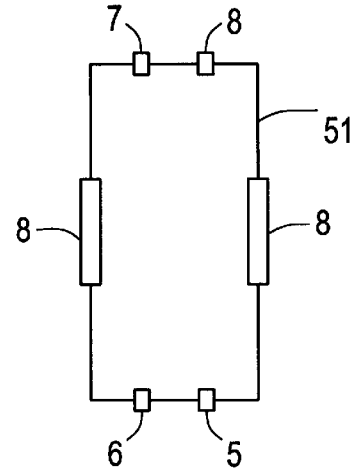

FIGS. 4A to 4E, FIGS. 5F to 5I, FIGS. 6J to 6M, and FIGS. 7N to 7Q illustrate the respective ceramic layers defining the multilayer substrate 42. FIGS. 4A and 4B illustrate the upper and lower surfaces of the first ceramic layer 51 (as counted from the bottom). FIGS. 4C to FIGS. 7P respectively illustrates the upper surfaces of the second to fifteenth ceramic layers 52 to 65. FIG. 7Q is a plan view of the multilayer substrate 42 including circuit components mounted thereon. The structure of the multilayer substrate 42 is described with reference to FIGS. 4 to 7.

The power supply terminal 5, the APC terminal 6, the LD terminal 7, and three GND terminals 8 are disposed on the periphery surface of the multilayer substrate 42 by baking an electrode material. These terminals 5, 6, 7, and 8 are shown on the peripheral surfaces of the ceramic layers 51 to 55 in FIGS. 4A to 5F. FIGS. 4A and 4B illustrate the upper and lower surfaces of the first ceramic layer 51. A copper electrode film 71 is disposed over the entire surface of the ceramic layer 51 and connected to the GND terminal 8. The power supply terminal 5, the APC terminal 6, the LD terminal 7, and the GND terminals 8 are arranged so as to also extend slightly on the lower surface of the ceramic layer 51 (that is, the lower surface of the multilayer substrate 42) so that the portions extending on the lower surface of the ceramic layer 51 function as electrodes for electrical connections of circuit elements of the superimposing circuit module 41, mounted on the surface of the multilayer substrate.

Figure 4C:
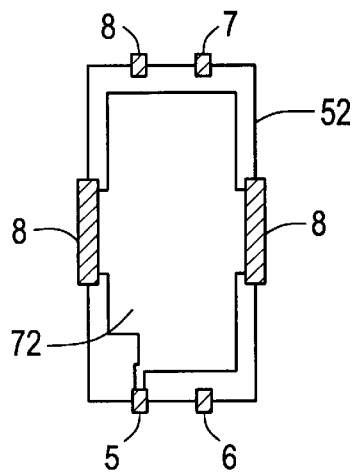
FIGS. 4C to 4E are top views illustrating the structures of the second to fourth layers.
Figure 4D:
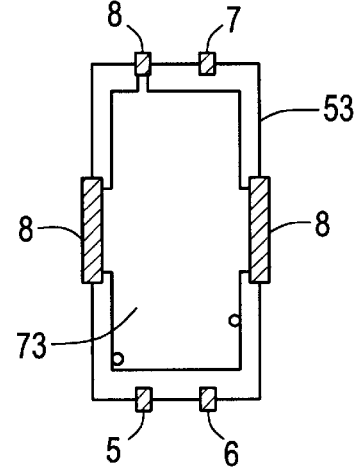
Figure 4E:
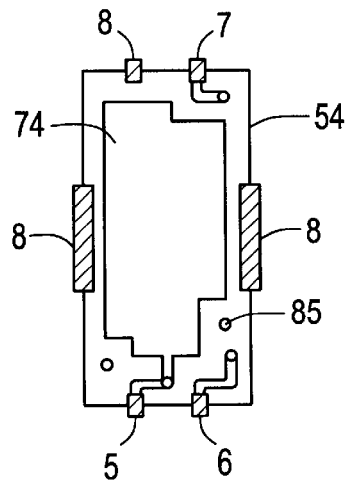
Figure 5F:
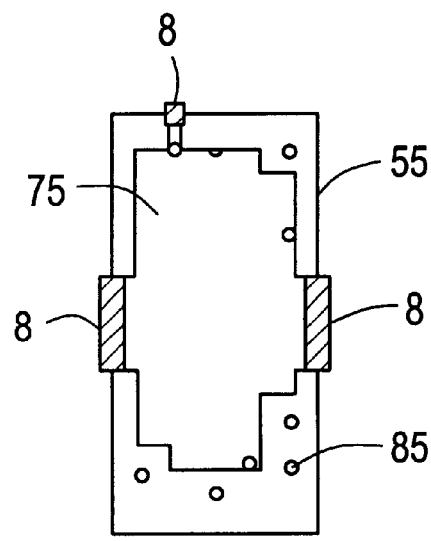
FIGS. 5F to 5I are top views illustrating the structures of the fifth to eighth layers of the multilayer substrate of the superimposing circuit module shown in FIG. 3.

As shown in FIG. 4C, a copper electrode film 72 is disposed over the almost entire upper surface of the second ceramic layer 52 (as counted from the bottom layer). This copper electrode film 72 is connected to the power supply terminal 5. As shown in FIG. 4D, a copper electrode film 73 is disposed over the almost entire upper surface of the third ceramic layer 53 (as counted from the bottom layer) and connected to the GND terminals 8. As shown in FIG. 4E, a copper electrode film 74 is disposed over the almost entire upper surface of the fourth ceramic layer 54 (as counted from the bottom layer) and connected to the power supply terminal 5. Furthermore, as shown in FIG. 5F, a copper electrode film 75 is disposed over the almost entire upper surface of the fifth ceramic layer 55 (as counted from the bottom layer) and connected to the GND terminals 8. Thus, of the copper electrode films 71 to 75 provided in the respective layers separated by the ceramic layers 52 to 55, the copper electrode films 71, 73, and 75 are connected to the GND terminals 8 and the copper electrode films 72 and 74 are connected to the power supply terminal 5 so that the multilayer capacitor 10 of the superimposing circuit 1 shown in FIG. 1 is defined by these copper electrode films 71 to 75. That is, the ceramic layers 51 and 55 define a part 43 of the oscillator. The copper electrode film 71 at the lowest layer also functions a shield plate on the lower surface of the multilayer substrate 42, for blocking electromagnetic waves.

Figure 5G:
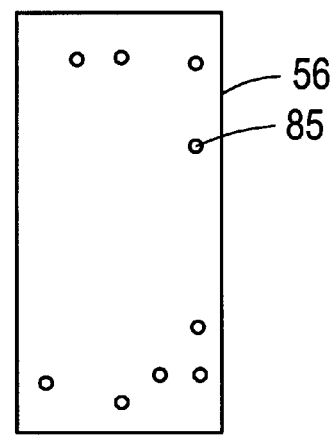
Figure 5H:
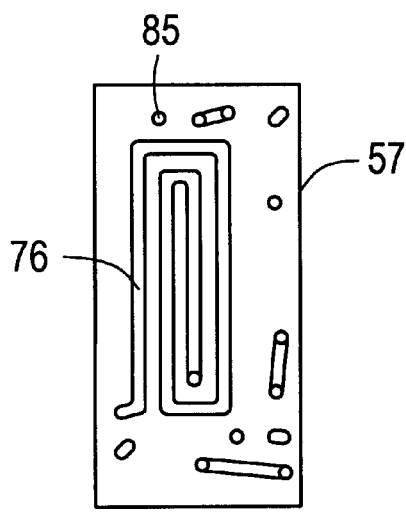
Figure 5I:
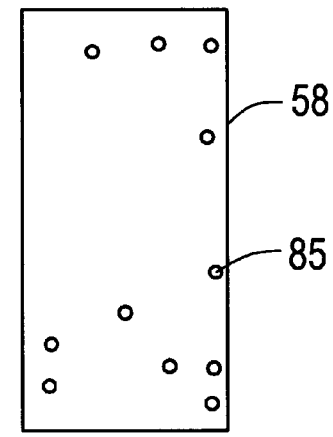

As shown in FIG. 5H, a spiral-shaped copper stripline electrode 76 is provided on the surface of the seventh (as counted from the bottom) ceramic layer 57 such that the copper stripline electrode 76 functions as the inductor 18 of the superimposing circuit. This ceramic layer 57 on the surface of which the inductor 18 is provided is disposed between the ceramic layer 56 at the lower layer and the ceramic layer 58 at the upper layer and these three ceramic layers are disposed on the ceramic layer 55. The ceramic layers 56 and 58 have only through-holes 85 as shown in FIGS. 5G and 5I.

Figure 6J:
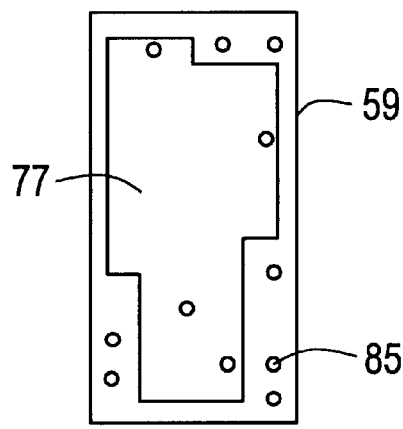
FIGS. 6J to 6M are top views illustrating the structures of the ninth to twelfth layers of the multilayer substrate of the superimposing circuit module shown in FIG. 3.
Figure 6K:
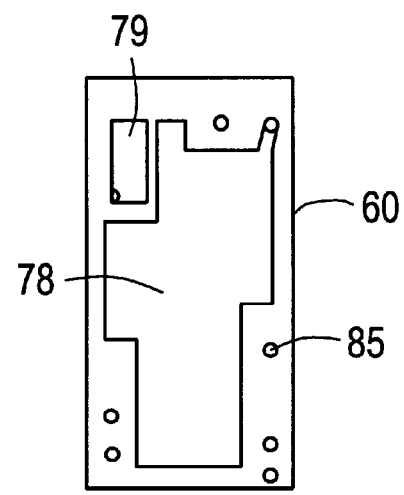

As shown in FIG. 6J, a copper electrode film 77 is disposed over the almost entire upper surface of the ninth ceramic layer 59 (as counted from the bottom layer). This copper electrode film 77 is connected to the GND terminals 8 such that it functions as a common ground electrode of the resonance circuit. As shown in FIG. 6K, a large-area copper electrode film 78 and a small-area copper electrode film 79 are disposed on the upper surface of the tenth ceramic layer 60 (as counted from the bottom layer). The lower copper electrode film 77 and the upper copper electrode film 78 form the capacitor 22 of the superimposing circuit. The lower copper electrode film 77 and the upper copper electrode film 79 define the capacitor 20 of the superimposing circuit.

Figure 6L:
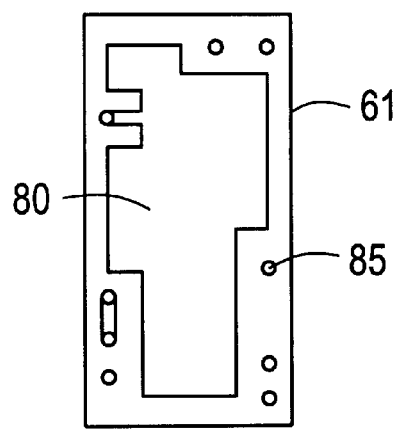

Furthermore, as shown in FIG. 6L, a copper electrode film 80 is disposed over the almost entire upper surface of the eleventh ceramic layer 61 (as counted from the bottom layer) such that the copper electrode film 80 and the copper electrode film 78 at the lower layer define the capacitor 21 of the superimposing circuit.

Figure 6M:
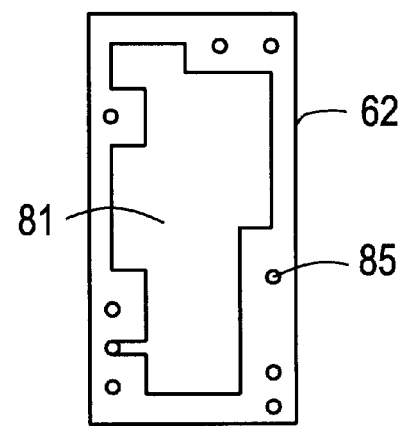

Similarly, as shown in FIG. 6M, a copper electrode film 81 is disposed over the almost entire upper surface of the twelfth ceramic layer 62 (as counted from the bottom layer) such that the copper electrode film 81 and the copper electrode film 80 at the lower layer define the capacitor 19 of the superimposing circuit.

Figure 7N:
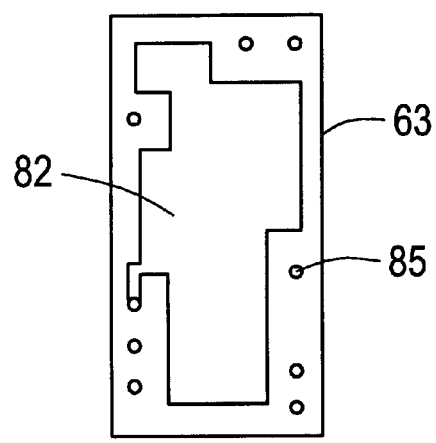
FIGS. 7N to 7P are top views illustrating the structures of the thirteenth to fifteenth layers of the multilayer substrate of the superimposing circuit module shown in FIG. 3.
Figure 7O:
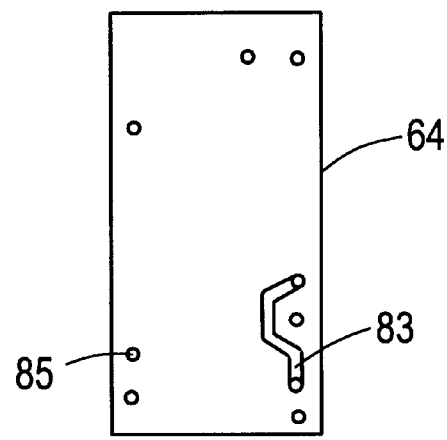
Figure 7P:
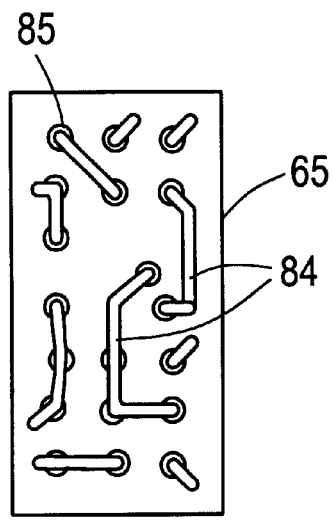
Figure 7Q:
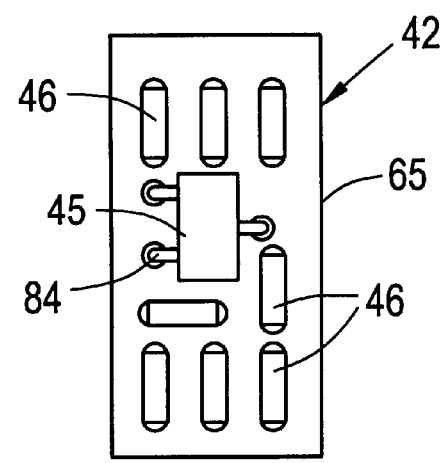
FIG. 7Q is a top view of the multilayer substrate including circuit components such as a transistor mounted on the surface thereof.

Furthermore, as shown in FIG. 7N, a copper electrode film 82 is disposed over the almost entire upper surface of the thirteenth ceramic layer 63 (as counted from the bottom layer) such that the copper electrode film 82 and the copper electrode film 81 at the lower layer define the capacitor 17 of the superimposing circuit.

Thus, the seventh to thirteenth ceramic layers 57 to 63 (as counted from the bottom layer) define a portion (the resonance circuit consisting of the capacitors 17, 19, and 20 and the inductor 18) of the oscillator.

On the thirteenth ceramic layer, there is disposed the fourteenth ceramic layer 64 (as counted from the bottom layer) on the surface of which an interconnection 83 of a copper electrode film is formed such that through-holes 85 are connected to each other. On the fourteenth ceramic layer, there is disposed the fifteenth ceramic layer 65 (top layer) on the surface of which an interconnections 84 of a copper electrode film are formed such that through-holes 85 are connected to each other. The transistor 13 and chip components such as the resistors 11, 12, and 15, the inductors 9, 14, and 33, and the capacitors 16 and 24 are mounted on the surface of the ceramic layer 65 at the top such that these components are connected to each other via the interconnections 84. Thus, the production of the multilayer substrate 42 is completed. In the multilayer substrate 42 produced in the above-described manner, the respective circuit elements are connected to one another via the through holes 85 and the interconnections 83 and 84 such that the superimposing circuit shown in FIG. 1 is obtained.

In the superimposing circuit module 41 according to preferred embodiments of the present invention, because some of the circuit elements of the oscillator 1 and the noise reduction filters 3 and 4 are embedded in the multilayer substrate 42, the size of the superimposing circuit module 41 is greatly reduced. The remaining circuit elements are mounted on the surface of the multilayer substrate. This technique allows a reduction in cost and allows the achievement of high performance in the high frequency band.

The reduction in the size of the superimposing circuit module 41 and the embedding of some circuit elements of the resonance circuit and the noise rejection filters 3 and 4 into the multilayer substrate allow a reduction in the length of an interconnection of a circuit element sensitive to noise. This suppresses spurious electromagnetic wave emission and prevents intrusion thereof into the power supply line or other elements. The electrode which is embedded in the multilayer substrate 42 and which is connected to the GND terminals 8 and the metal case 45 covering the surface of the multilayer substrate allow a further reduction in emission or leakage of a spurious signal.

The embedding of the capacitors 17, 19, and 20 and the inductor 18 defining the resonance circuit into the multilayer substrate 42 allows a reduction in the length of interconnections among the circuit elements and thus a reduction in parasitic inductance or parasitic capacitance. This allows for a great improvement in stability of oscillation.

Furthermore, the formation of the superimposing circuit module 41 including the multilayer substrate 42 allows reductions in variations in characteristics of the respective circuit elements. As a result, matching adjustment among the circuit elements becomes unnecessary.

As described above, various preferred embodiments of the present invention provides great advantages. That is, because some or all of circuit elements of the oscillator or the noise rejection filters are embedded in the multilayer substrate, the size of the superimposing circuit module can be reduced. The reduction in the size of the superimposing circuit module results in a reduction in the length of the interconnection pattern disposed on the surface of the substrate, which in turn results in a reduction in spurious signal emission.

Furthermore, the multilayer structure and the reduced size of the oscillator or the noise rejection filters allow for reductions in the number of manufacturing steps and manufacturing cost. Furthermore, in this superimposing circuit module, because the circuit elements of the oscillator can be formed by printing electrodes or interconnection conductors, the variations in the circuit parameters are minimized.

The amplification device such as a transistor is preferably mounted on the surface of the multilayer substrate so that the superimposing circuit module has a very simple structure.

The surface of the multilayer substrate is preferably covered with the metal case to achieve a further reduction in the spurious signal emission. Because only the surface of the multilayer substrate is covered with the metal case, the size of the superimposing circuit module can be reduced and thus the cost thereof can also be reduced.

If the multilayer substrate includes a lamination of a copper electrode film and a low-temperature-baked ceramic layer, it becomes possible to embed, in the multilayer substrate, not only a capacitor plate and an inductor but also a shield plate for blocking an electromagnetic wave.

Although the present invention has been described through illustration of its preferred embodiments, it is to be understood that the preferred embodiments are only illustrative and that various changes and modifications may be made thereto without departing from the scope of the present invention which is limited solely by the appended claims.

What is claimed is:

1. A superimposing circuit module comprising:
   a superimposing circuit for reducing an effect of returned light upon a laser light source for illuminating an information storage medium with a laser beam, the superimposing circuit module including a plurality of circuit elements defining an oscillator; wherein
   at least a portion of the plurality of circuit elements defining the oscillator are embedded in a multilayer substrate; and
   the superimposing circuit includes an oscillator, a matching circuit, and a plurality of noise rejection filters.

2. A superimposing circuit module according to claim 1, wherein an amplification device is mounted on the surface of said multilayer substrate.

3. A superimposing circuit module according to claim 1, wherein the surface of said multilayer substrate is covered with a metal case.

4. A superimposing circuit module according to claim 1, wherein said multilayer substrate includes a copper electrode film and a low-temperature-baked ceramic layer.

5. A superimposing circuit module according to claim 1, wherein one of the plurality of noise rejection filters is located between the power supply terminal and the oscillator.

6. A superimposing circuit module comprising:
   a superimposing circuit for reducing effect of returned light upon a laser light source for illuminating an information storage medium with a laser beam, the superimposing circuit module including a plurality of circuit elements defining an oscillator; wherein
   at least a portion of the plurality of circuit elements defining the oscillator are embedded in a multilayer substrate; and
   an inductor is disposed between a power supply terminal and an input terminal of the oscillator, and a capacitor is disposed between the power supply terminal and a ground terminal.

7. A superimposing circuit module comprising:

a superimposing circuit for reducing an effect of returned light upon a laser light source for illuminating an information storage medium with a laser beam, the superimposing circuit module including a plurality of circuit elements defining an oscillator; wherein at least a portion of the plurality of circuit elements defining the oscillator are embedded in a multilayer substrate; and in the oscillator, at least a pair of resistors are connected in series between an input of the oscillator and a ground terminal.

8. A superimposing circuit module according to claim 7, wherein in the oscillator, a transistor, an inductor, and a resistor are connected in series between an input of the oscillator and a ground terminal.

9. A superimposing circuit module according to claim 8, wherein a capacitor is disposed between the input of the oscillator and the ground terminal.

10. A superimposing circuit module according to claim 8, wherein a capacitor and an inductor are connected in series between the base of the transistor and the ground terminal.

11. A superimposing circuit module according to claim 8, wherein two capacitors are connected in series between the base of the transistor and the ground terminal.

12. A superimposing circuit module according to claim 8, wherein at least a pair of capacitors are connected in series between the emitter of the transistor and the ground terminal so as to define a matching circuit for achieving matching with a laser diode.

13. A superimposing circuit module comprising:

a superimposing circuit for reducing an effect of returned light upon a laser light source for illuminating an information storage medium with a laser beam, the superimposing circuit module including a plurality of circuit elements defining a noise rejection filter; wherein at least a portion of the plurality of the circuit elements defining the noise rejection filter in said superimposing circuit are embedded in a multilayer substrate; and the superimposing circuit includes an oscillator, a matching circuit, and a plurality of noise rejection filters.

14. A superimposing circuit module according to claim 13, wherein an amplification device is mounted on the surface of said multilayer substrate.

15. A superimposing circuit module according to claim 13, wherein the surface of said multilayer substrate is covered with a metal case.

16. A superimposing circuit module according to claim 13, wherein said multilayer substrate includes a copper electrode film and a low-temperature-baked ceramic layer.

17. A superimposing circuit module according to claim 13, wherein one of the plurality of noise rejection filters is located between the power supply terminal and the oscillator.

18. A superimposing circuit module comprising:

a superimposing circuit for reducing an effect of returned light upon a laser light source for illuminating an information storage medium with a laser beam, the superimposing circuit module including a plurality of circuit elements defining a noise rejection filter; wherein at least a portion of the plurality of the circuit elements defining the noise rejection filter in said superimposing circuit are embedded in a multilayer substrate; and an inductor is disposed between a power supply terminal and an input terminal of the oscillator, and a capacitor is disposed between the power supply terminal and a ground terminal.

19. A superimposing circuit module comprising:

a superimposing circuit for reducing an effect of returned light upon a laser light source for illuminating an information storage medium with a laser beam, the superimposing circuit module including a plurality of circuit elements defining a noise rejection filter; wherein at least a portion of the plurality of the circuit elements defining the noise rejection filter in said superimposing circuit are embedded in a multilayer substrate; and in the oscillator, at least a pair of resistors are connected in series between an input of the oscillator and a ground terminal.

20. A superimposing circuit module according to claim 19, wherein in the oscillator, a transistor, an inductor, and a resistor are connected in series between an input of the oscillator and a ground terminal.

21. A superimposing circuit module according to claim 20, wherein a capacitor is disposed between the input of the oscillator and the ground terminal.

22. A superimposing circuit module according to claim 20, wherein a capacitor and an inductor are connected in series between the base of the transistor and the ground terminal.

23. A superimposing circuit module according to claim 20, wherein two capacitors are connected in series between the base of the transistor and the ground terminal.

24. A superimposing circuit module according to claim 20, wherein at least a pair of capacitors are connected in series between the emitter of the transistor and the ground terminal so as to define a matching circuit for achieving matching with a laser diode.

25. A superimposing circuit module according to claim 6, wherein an amplification device is mounted on the surface of said multilayer substrate.

26. A superimposing circuit module according to claim 6, wherein the surface of said multilayer substrate is covered with a metal case.

27. A superimposing circuit module according to claim 6, wherein said multilayer substrate includes a copper electrode film and a low-temperature-baked ceramic layer.

28. A superimposing circuit module according to claim 7, wherein an amplification device is mounted on the surface of said multilayer substrate.

29. A superimposing circuit module according to claim 7, wherein the surface of said multilayer substrate is covered with a metal case.

30. A superimposing circuit module according to claim 7, wherein said multilayer substrate includes a copper electrode film and a low-temperature-baked ceramic layer.

31. A superimposing circuit module according to claim 18, wherein an amplification device is mounted on the surface of said multilayer substrate.

32. A superimposing circuit module according to claim 18, wherein the surface of said multilayer substrate is covered with a metal case.

33. A superimposing circuit module according to claim 18, wherein said multilayer substrate includes a copper electrode film and a low-temperature-baked ceramic layer.

34. A superimposing circuit module according to claim 19, wherein an amplification device is mounted on the surface of said multilayer substrate.

35. A superimposing circuit module according to claim 19, wherein the surface of said multilayer substrate is covered with a metal case.

36. A superimposing circuit module according to claim 19, wherein said multilayer substrate includes a copper electrode film and a low-temperature-baked ceramic layer.

* * * * *